(12) United States Patent
Kelkar

(10) Patent No.: US 7,489,207 B1
(45) Date of Patent: Feb. 10, 2009

(54) STRUCTURE FOR VOLTAGE CONTROLLED OSCILLATOR

(75) Inventor: Ram Kelkar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/107,251

(22) Filed: Apr. 22, 2008

(51) Int. Cl.
*H03B 5/12* (2006.01)

(52) U.S. Cl. .................................. 331/117 R; 331/167

(58) Field of Classification Search ............. 331/117 R, 331/176
See application file for complete search history.

(56) References Cited

U.S. PATENT DOCUMENTS

| | | |
|---|---|---|
| 4,485,355 A | 11/1984 | Scott |
| 4,692,718 A | 9/1987 | Roza et al. |
| 6,606,008 B2 | 8/2003 | Traub |
| 6,720,838 B2 * | 4/2004 | Locke ..................... 331/117 R |
| 6,753,738 B1 * | 6/2004 | Baird ........................... 331/25 |
| 6,782,499 B2 | 8/2004 | Osada et al. |
| 6,933,794 B2 * | 8/2005 | Ogiso ..................... 331/107 A |
| 7,053,726 B2 | 5/2006 | Hino |
| 7,098,746 B2 * | 8/2006 | Heijden et al. ................. 331/78 |
| 7,126,435 B2 * | 10/2006 | Naviasky et al. ............. 331/182 |
| 2008/0007366 A1 | 1/2008 | Bevilacqua et al. |
| 2008/0048794 A1 | 2/2008 | Mccorquodale et al. |

FOREIGN PATENT DOCUMENTS

| | | | |
|---|---|---|---|
| EP | 0810723 | B1 | 8/2001 |
| EP | 1333574 | A2 | 1/2003 |

* cited by examiner

*Primary Examiner*—Joseph Chang
(74) *Attorney, Agent, or Firm*—Jackson Patent Law Office

(57) ABSTRACT

Disclosed are design structures for systems and methods of generating a periodic signal.

1 Claim, 5 Drawing Sheets

STRUCTURE FOR VOLTAGE CONTROLLED OSCILLATOR

BACKGROUND OF THE INVENTION

1. Field of the Invention

This invention relates generally to a design structure for systems and methods generating a signal and, more particularly, to a design structure for systems and methods of generating an oscillation signal.

2. Description of Related Art

An oscillator may include cross coupled NFETs to provide the −gm needed to ensure oscillation. The −gm needed depends on the capacitance and thus the cross-coupled NFETs are sized to handle the max capacitance, which corresponds to the lowest frequency.

SUMMARY OF THE INVENTION

There is a design structure embodied in a machine readable medium for designing, manufacturing, or testing an integrated circuit. The design structure comprises a circuit comprising a first node; a second node; an inductor having a first end coupled to the first node and a second end coupled to the second node; a capacitor having a first end coupled to the first node and a second end coupled to the second node; a first transistor having a current path coupled between the second node and a reference voltage and control input coupled to the first node; a second transistor having a current path coupled between the first node and the reference voltage and a control input coupled to the second node; a first multiplexor having a current path; a third transistor having a current path coupled between the second node and the reference voltage and a control input coupled to the current path of the first multiplexor; a second multiplexor having a current path; and a fourth transistor having a current path coupled between the first node and the reference voltage and a control input coupled to the current path of the second multiplexor.

BRIEF DESCRIPTION OF THE DRAWINGS

References are made to the following text taken in connection with the accompanying drawings, in which.

The accompanying drawings which are incorporated in and which constitute a part of this specification, illustrate embodiments of the invention and, together with the description, explain the principles of the invention, and additional advantages thereof. Certain drawings are not necessarily to scale, and certain features may be shown larger than relative actual size to facilitate a more clear description of those features. Throughout the drawings, corresponding elements are labeled with corresponding reference numbers.

DETAILED DESCRIPTION OF EXEMPLARY EMBODIMENTS

First Exemplary Embodiment

Figure 1:
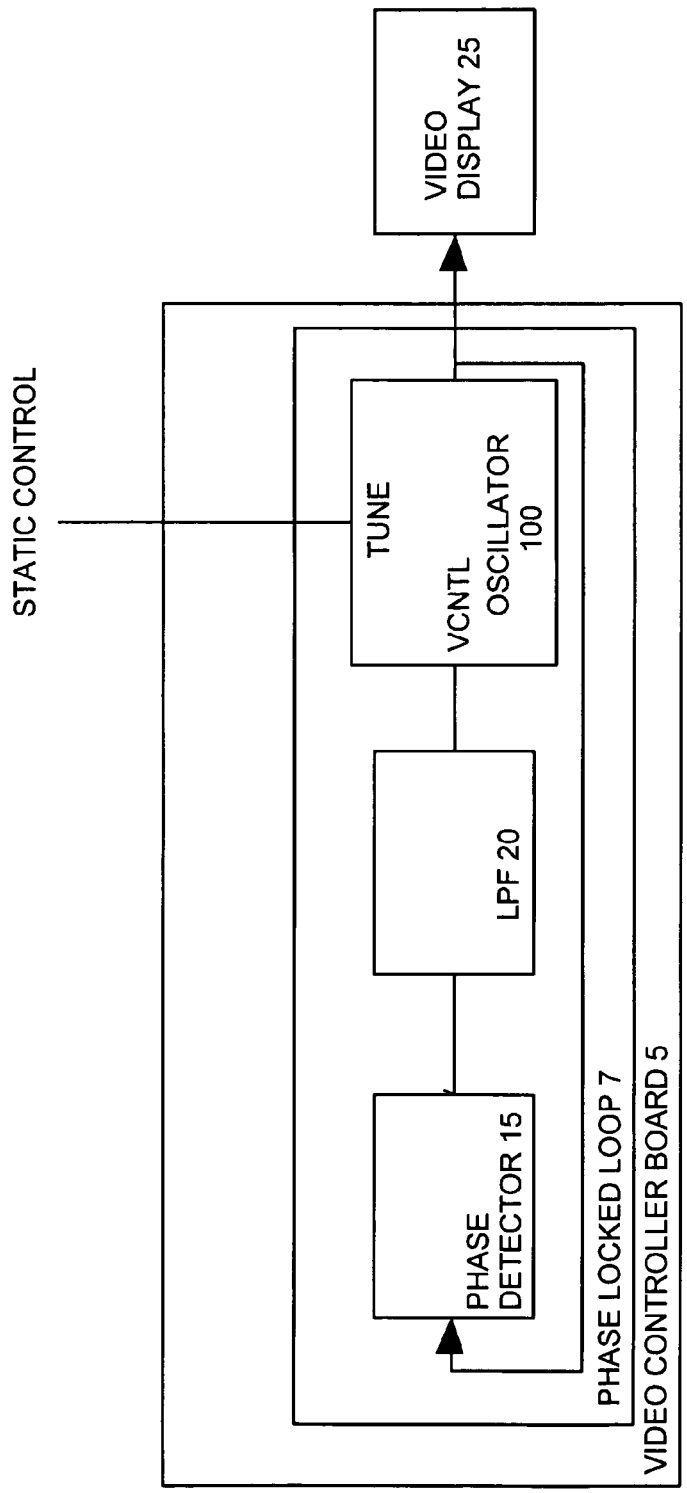
FIG. 1 is a diagram of a system employing an oscillator circuit in accordance with a first embodiment of the present invention.

FIG. 1 shows system 1 including video controller board 5 and video display 25. Video controller board 5 generates signals to drive video display 25, according to a first exemplary embodiment of the present invention. Video controller board 5 is plugged into a backplane, Video controller board 5 includes phased locked loop 7, phase detector 15, low pass filter 20, and voltage controlled oscillator 100. Voltage controlled oscillator 100 has a dynamic control input VCNTL, and a static control input TUNE, and an output coupled to phase detector 15.

Figure 2:
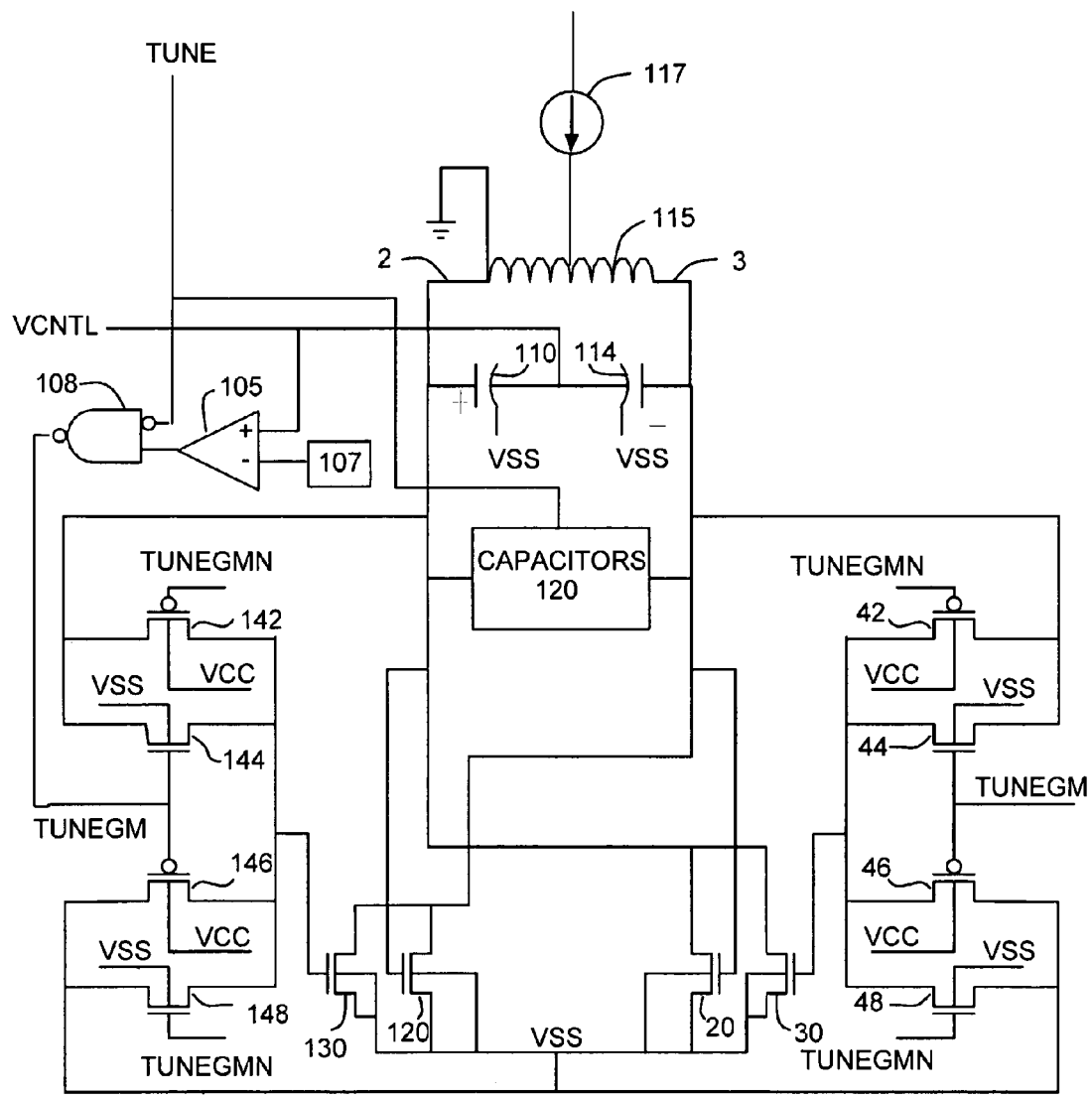
FIG. 2 is a diagram of emphasizing an aspect of the system shown in FIG. 1.

FIG. 2 shows the schematic of voltage controlled oscillator 100 in phase locked loop circuit 7. The inductor 115 and capacitors 110, 114, and 120 form the tank whose oscillation frequency depends primarily on the inductance and capacitance. The inductor 115 is center-tapped and is fed from a current source 117.

Capacitors 110 and 114 are connected to the filter node VCNTL and the value of these capacitors 110 and 114 varies as the voltage at VCNTL changes.

Capacitors 120 have a control input that can be connected to either VSS or VCC based on the signal TUNE. With TUNE set to 0, the control input is connected to VCC and thus capacitors 120 have a small value. With TUNE set to 1 the control input is connected to VSS, thereby increasing the value of capacitors 120. Capacitors 120 have a fixed value depending on whether the control input is connected to VCC or VSS. The value does not change with the voltage at VCNTL and thus capacitors 120 are called fixed caps. The total capacitance is the sum of the fixed and variable caps. There may be more than set of fixed caps each controlled in a similar manner. Tune may be set in a variety of ways, including dipswitch settings or software.

Cross coupled NFETs 20 and 120 provide the −gm to promote oscillation.

Each set of NFETs has a gate connected to the inductor 115. The other has a gate that can be connected to either VSS or to the inductor 115. The signal TUNEGM is used to select the gate connection. When this signal is low the gate is connected to VSS and this NFET is not active. When TUNEGM is 1 then the gate is connected to the inductor. When the NFET gate is connected to VSS it does not provide any −gm to the tank VCO. Thus the use of TUNEGM results in a circuit where the −gm provided can be controlled.

More specifically, NFET 20 has its source connected to VSS, its drain connected to node 2, and its gate connected to node 3. NFET 30 has its source connected to VSS, its drain connected to node 2, and its gate selectively coupled to either VSS or node 3, via a multiplexor constituted by pFET 42, and NFET 44, pFET 46, and NFET 48. The control inputs of this multiplexor are coupled to TUNEGM and TUNEGMN (NOT TUNEGM).

NFET 120 has its source connected to VSS, its drain connected to node 3, and its gate connected to node 2. NFET 130 has its source connected to VSS, its drain connected to node 3, and its gate selectively coupled to either VSS or node 2, via a multiplexor constituted by pFET 142, and NFET 144, pFET 146, and NFET 148. The control inputs of this multiplexor are coupled to TUNEGM and TUNEGMN (NOT TUNEGM).

Thus, under certain conditions, setting TUNEGM to 1 results in a higher oscillation amplitude and higher oscillation frequency.

The gates of nFETs 30 and 130 are automatically switched. A comparator 105 compares the voltage at VCNTL with a user-settable reference voltage 107 and the output of comparator 105 goes high when the threshold is exceeded. Reference voltage 107 may be set in a variety of ways, including dipswitch settings or software.

This is to ensure that transistors 30 and 130 contribute to −gm on for lower values of VCNTL where the oscillation frequency is lower and the oscillation amplitude tends to be low. At these operating points disabling transistors 30 and 130 would further reduce the amplitude. The output of comparator 105 is ANDed with NOT TUNE to disable transistors 30 and 130 only when TUNE is 0 (only when capacitors 20 have low values) and VCNTL is above a user-settable reference voltage 107.

Second Exemplary Embodiment

Figure 3:
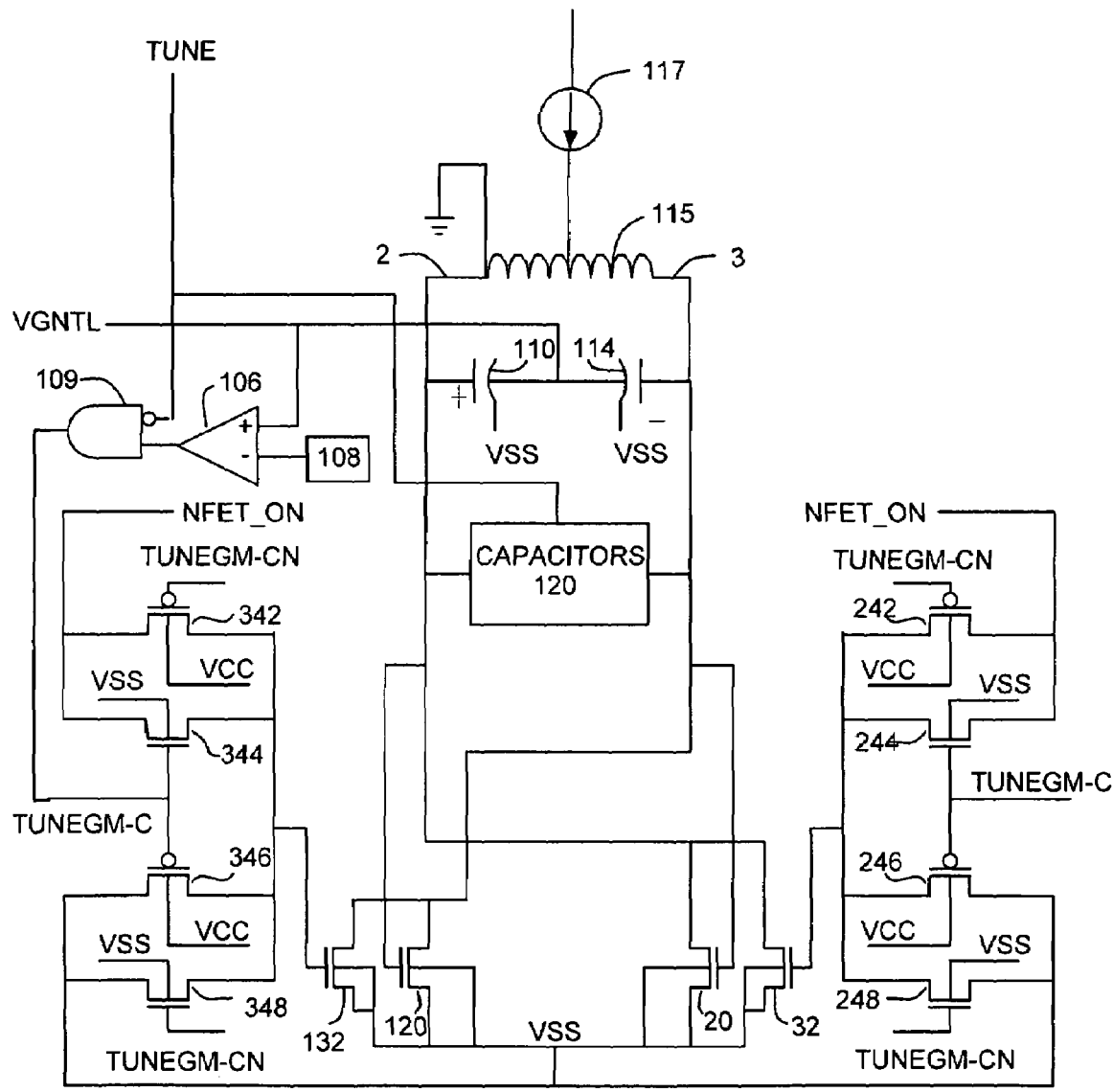
FIG. 3 is a diagram of an oscillator circuit in accordance with a second embodiment of the present invention.

FIG. 3 shows voltage controlled oscillator 102 in accordance with a second embodiment of the present invention. Oscillator 102 is in a phase locked loop having the structure of the phase lock loop 7 shown in FIG. 1.

Cross coupled NFETs 20 and 120 provide the −gm to promote oscillation.

Each set of NFETs has a gate connected to the inductor 115. The other has a gate that can be connected to either VSS or to the reference voltage NFET_ON. The signal TUNEGM-C is used to select the gate connection. When this signal is low the gate is connected to VSS and this NFET is not active. When TUNEGM-C is 1 then the gate is connected to NFET_ON, thereby causing the NFET to steal current from the NFET that contributes to −gm, thereby lowering −gm.

More specifically, NFET 20 has its source connected to VSS, its drain connected to node 2, and its gate connected to node 3. NFET 32 has its source connected to VSS, its drain connected to node 2, and its gate selectively coupled to either VSS or NFET_ON, via a multiplexor constituted by pFET 242, and NFET 244, pFET 246, and NFET 248.

NFET 120 has its source connected to VSS, its drain connected to node 3, and its gate connected to node 2. NFET 132 has its source connected to VSS, its drain connected to node 3, and its gate selectively coupled to either VSS or NFET_ON, via a multiplexor constituted by pFET 342, and NFET 344, pFET 346, and NFET 348.

Thus, under certain conditions, changing TUNEGM-C changes the gain of the oscillator circuit 102 and results in a higher frequency range, The gates of nFETs 30 and 132 are automatically switched. A comparator 106 compares the voltage at VCNTL with a user-settable reference voltage 108 and the output of comparator 106 goes high when the threshold is exceeded. This is to ensure that current stealing is not turned on for lower values of VCNTL where the oscillation frequency is lower and the oscillation amplitude tends to be low. At these operating points turning on current stealing would further reduce the amplitude. The output of comparator 105 is ANDed with NOT TUNE to turn on current stealing only when TUNE is 0 (only when capacitors 20 have low values) and VCNTL is above a user-settable reference voltage 107.

Third Exemplary Embodiment

Figure 4:
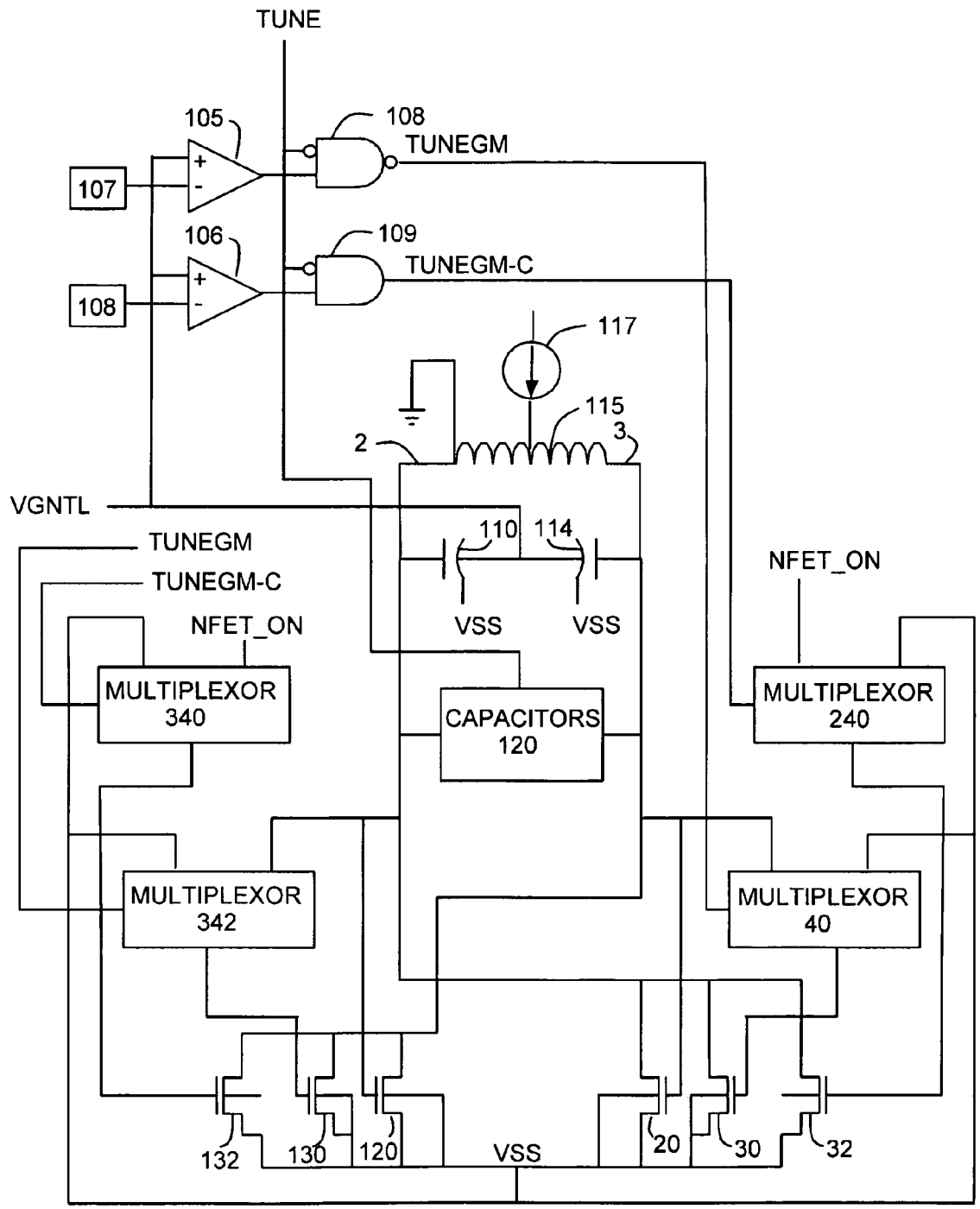
FIG. 4 is a diagram of a system employing an oscillator circuit in accordance with a third embodiment of the present invention.

FIG. 4 shows voltage controlled oscillator 103 in accordance with a second embodiment of the present invention, employing both structure-based gm control and current-based gm control.

Design Structure

Figure 5:
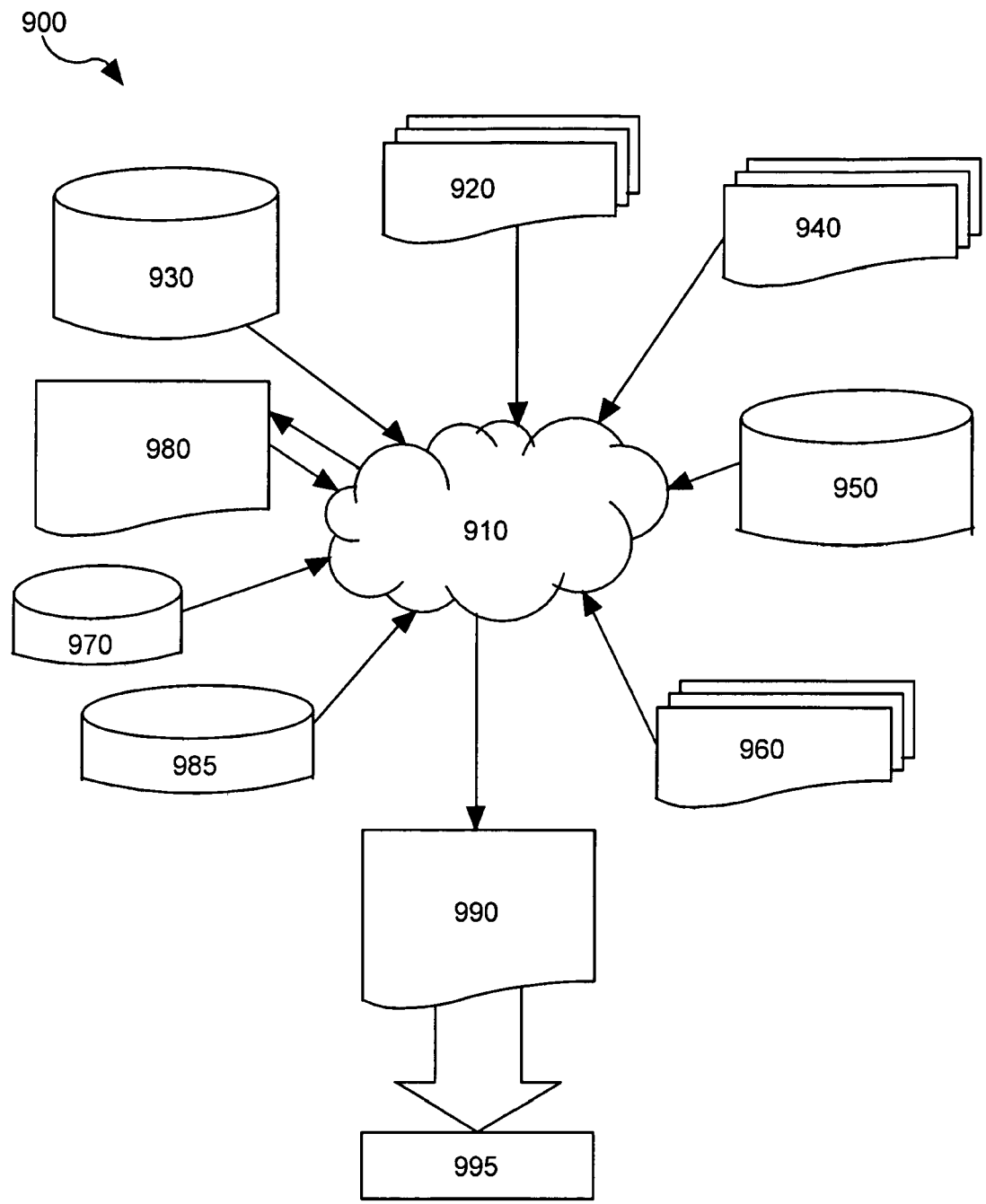
FIG. 5 is a flow diagram of a design process used in semiconductor design, manufacture, and/or test.

FIG. 5 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIG. 1, 3, or 4 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 1, 3, or 4. Design process 910 preferably synthesizes (or translates) an embodiment of the invention as shown in FIG. 1, 3, or 4 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 1, 3, or 4, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1, 3, or 4. Design structure 990 may then proceed to a stage 995 where, for example, design structure 990: proceeds to tape-out, is released to manufacturing, is released to a mask house, is sent to another design house, is sent back to the customer, etc.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

What is claimed is:

1. A design structure embodied in a machine readable medium for designing, manufacturing, or testing an integrated circuit, the design structure comprising a circuit comprising:
- a first node;
- a second node;
- an inductor having a first end coupled to the first node and a second end coupled to the second node;
- a capacitor having a first end coupled to the first node and a second end coupled to the second node;
- a first transistor having a current path coupled between the second node and a reference voltage and control input coupled to the first node;
- a second transistor having a current path coupled between the first node and the reference voltage and a control input coupled to the second node;
- a first multiplexor having a current path;
- a third transistor having a current path coupled between the second node and the reference voltage and a control input coupled to the current path of the first multiplexor;
- a second multiplexor having a current path; and
- a fourth transistor having a current path coupled between the first node and the reference voltage and a control input coupled to the current path of the second multiplexor.

* * * * *